United States Patent
Shih et al.

(10) Patent No.: US 12,191,347 B2
(45) Date of Patent: *Jan. 7, 2025

(54) HIGH DENSITY METAL INSULATOR METAL CAPACITOR

(71) Applicant: Taiwan Semiconductor Manufacturing Co., Ltd., Hsin-Chu (TW)

(72) Inventors: Wei Kai Shih, Nantou County (TW); Kuo-Liang Wang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/231,754

(22) Filed: Aug. 8, 2023

(65) Prior Publication Data

US 2023/0387187 A1 Nov. 30, 2023

Related U.S. Application Data

(63) Continuation of application No. 17/502,924, filed on Oct. 15, 2021, now Pat. No. 11,776,991, which is a continuation of application No. 17/021,706, filed on Sep. 15, 2020, now Pat. No. 11,164,935.

(51) Int. Cl.
*H01L 23/522* (2006.01)
*H01L 49/02* (2006.01)

(52) U.S. Cl.
CPC .......... *H01L 28/55* (2013.01); *H01L 23/5223* (2013.01); *H01L 28/40* (2013.01); *H01L 28/60* (2013.01); *H01L 28/86* (2013.01); *H01L 28/90* (2013.01); *H01L 28/91* (2013.01); *H01L 28/92* (2013.01)

(58) Field of Classification Search
CPC ......... H01L 28/55; H01L 28/40; H01L 28/60; H01L 28/86; H01L 23/5223; H01L 28/90
See application file for complete search history.

(56) References Cited

U.S. PATENT DOCUMENTS

| | | | |
|---|---|---|---|
| 7,579,643 B2 | 8/2009 | Oh et al. | |
| 8,901,710 B2 | 12/2014 | Anderson et al. | |
| 9,224,685 B1 * | 12/2015 | Ding | H01L 23/522 |
| 11,164,935 B1 | 11/2021 | Shih et al. | |
| 11,776,991 B2 * | 10/2023 | Shih | H01L 28/86 |
| | | | 257/532 |
| 2006/0180895 A1 * | 8/2006 | Chen | H01L 23/5225 |
| | | | 257/595 |
| 2011/0254130 A1 | 10/2011 | Furumiya et al. | |
| 2018/0130713 A1 | 5/2018 | Cantoro et al. | |

FOREIGN PATENT DOCUMENTS

TW 200805571 A 1/2008

* cited by examiner

*Primary Examiner* — Jose R Diaz
(74) *Attorney, Agent, or Firm* — Duane Morris LLP (57) ABSTRACT

Semiconductor devices and methods are disclosed herein. In one example, a disclosed semiconductor device includes: an insulation layer, a first electrode with sidewalls and a bottom surface in contact with the insulation layer; a second electrode with sidewalls and a bottom surface in contact with the insulation layer; and an insulator formed between the first electrode and the second electrode. The insulator is coupled to a sidewall of the first electrode and coupled to a sidewall of the second electrode.

20 Claims, 12 Drawing Sheets

HIGH DENSITY METAL INSULATOR METAL CAPACITOR

CROSS-REFERENCE TO RELATED APPLICATION

This application is a continuation of U.S. patent application Ser. No. 17/502,924, which is a continuation of U.S. patent application Ser. No. 17/021,706, filed on Sep. 15, 2020, now U.S. Pat. No. 11,164,935, each of which is incorporated by reference herein in their entireties.

BACKGROUND

Capacitors, e.g. metal-insulator-metal (MIM) capacitors, are widely used in integrated circuits, such as mixed signal circuits, analog circuits, Radio Frequency (RF) circuits, Dynamic Random Access Memories (DRAMs), embedded DRAMs, and logic operation circuits. The capacitance of a capacitor is proportional to the capacitor area and the dielectric constant (k) of the insulation layer, and is inversely proportional to the thickness of the insulation layer. Therefore, to increase the capacitance, it is preferable to increase the area and k value and to reduce the thickness of the insulation layer.

A problem associated with the increased area is that a greater chip area is required for conventional MIM capacitors, which have various horizontal comb structures and occupy a large layout area to induce a low area density. In addition, each conventional MIM capacitor needs a capacitor top metal (CTM) electrode arranged over the dielectric layer, which induces an extra cost to make a mask and perform an etching process to form the MIM capacitor. Thus, existing MIM capacitors and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides various embodiments of a novel capacitor structure and methods to form the same. In some embodiments, the disclosed capacitor structure includes a plurality of MIM capacitors formed on an insulation layer. Each of the MIM capacitors includes two finger type metal contacts vertically extending on the insulation layer. The two finger type metal contacts serve as two electrodes separated by a dielectric insulator to form the MIM capacitor. The insulation layer is formed on a substrate and serves as a stop layer for the metal contacts to electrically isolate the two metal contacts. With this novel structure, the disclosed MIM capacitors can achieve a high area density. In addition, a method to form the disclosed MIM capacitors does not need an extra mask or etching process to form a capacitor top metal (CTM) electrode. The present disclosure is applicable to any semiconductor device including a capacitor.

Figure 1:
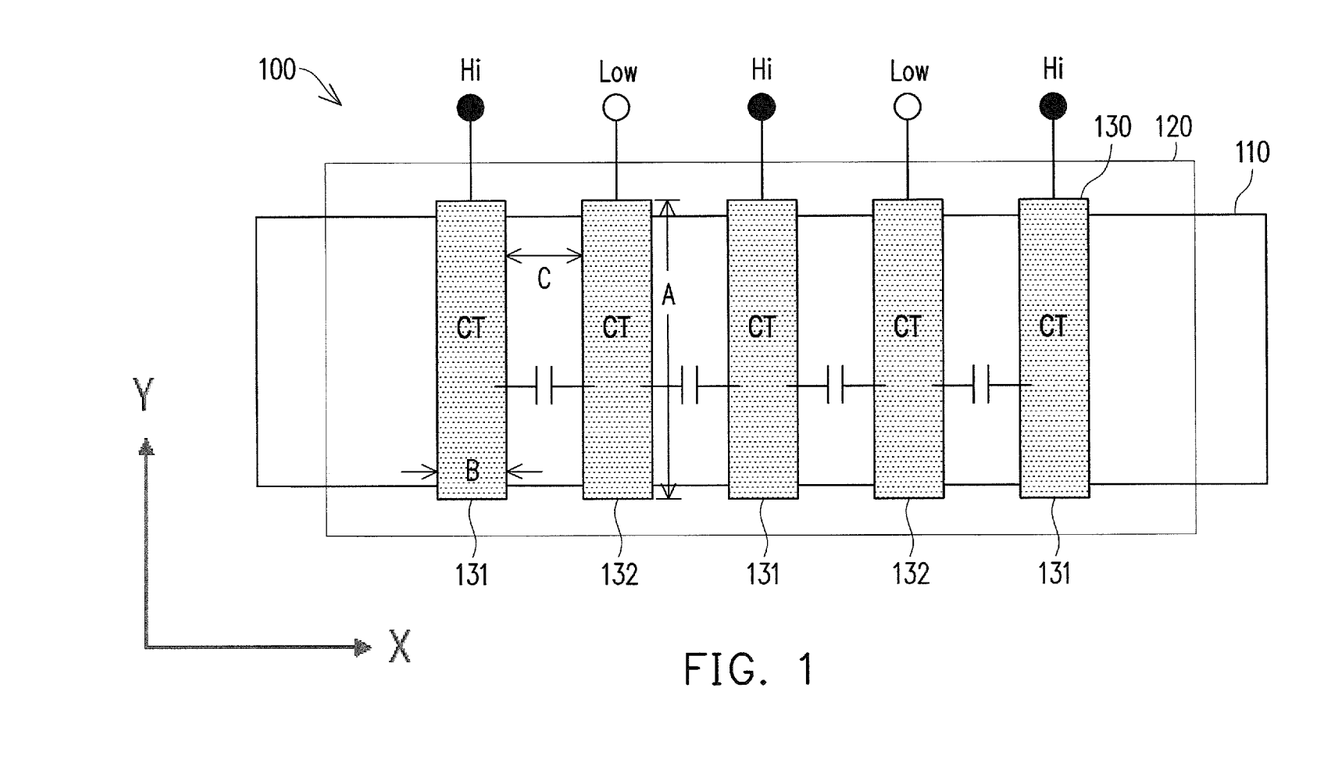
FIG. 1 illustrates an exemplary layout of a semiconductor device having vertical capacitor structures, in accordance with some embodiments of the present disclosure.

FIG. 1 illustrates an exemplary layout of a semiconductor device 100 having vertical capacitor structures, in accordance with some embodiments of the present disclosure. As shown in FIG. 1, there are multiple electrodes 130 arranged in parallel over an active region 110. In one embodiment, the active region 110 serves as a substrate for the multiple electrodes 130. Each of the multiple electrodes 130 may comprise a conductive material, e.g. a metal like tungsten, aluminum, copper, etc. In one embodiment, the multiple electrodes 130 are formed in a contact layer of the semiconductor device 100, such that each of the multiple electrodes 130 is a contact (CT) comprising tungsten. Every two adjacent electrodes 130 are separated by an insulator (not shown in FIG. 1) comprising a dielectric material to form a capacitor.

The active region 110 may comprise a semiconductor material, e.g. silicon. To electrically isolate the multiple electrodes 130 from each other, the multiple electrodes 130 are not formed directly onto the active region 110 comprising silicon. The semiconductor device 100 comprises an insulation layer 120 formed on the active region 110 and below the multiple electrodes 130. The insulation layer 120 comprises a dielectric material, e.g. silicon oxide, silicon nitride, etc. In one embodiment, the insulation layer 120 comprises a resist protective oxide (RPO). In one embodiment, the insulation layer 120 comprises a plurality of sub-layers. For example, the insulation layer 120 comprises at least one nitride layer and at least one oxide layer. The insulation layer 120 serves as a stop layer for the multiple electrodes 130 to stop onto.

As shown in FIG. 1, the multiple electrodes 130 are divided into two groups of electrodes: a group of first electrodes 131 and a group of second electrodes 132. The group of first electrodes 131 and the group of second electrodes 132 are interlaced with each other. There are not two adjacent electrodes belonging to a same group. As shown in FIG. 1, the group of first electrodes 131 are electrically connected to a logic high voltage; and the group of second electrodes 132 are electrically connected to a logic low voltage. There are not two adjacent electrodes electrically connected to a same voltage. As such, the group of first electrodes 131 and the group of second electrodes 132 form a plurality of capacitors connected in series. In one embodiment, each of the plurality of capacitors is a metal insulator metal (MIM) capacitor, since each capacitor is formed by: two adjacent electrodes made of a metal, and an insulator between the adjacent two electrodes.

As shown in FIG. 1, the first and second electrodes 131, 132 form an electrode array extending along the X direction, while each of the first and second electrodes 131, 132 extends along the Y direction perpendicular to the X direction. As shown in FIG. 1, each of the group of first electrodes 131 and the group of second electrodes 132 has a top surface with a rectangular shape. The rectangular shape has a first dimension A and a second dimension B. In one embodiment, the first dimension A is at least 0.22 micrometer. In one embodiment, the second dimension B is at least 0.19 micrometer. In one embodiment, the first dimension A is greater than the second dimension B, where the first dimension A extends along the Y direction and the second dimension B extends along the X direction perpendicular to the Y direction. In one embodiment, the first dimension A is longer than the second dimension B by more than 50%. In one embodiment, the first dimension A is longer than the second dimension B by more than 100%. In one embodiment, the first dimension A is longer than the second dimension B by more than 200%. According to various embodiments, the rectangular shape has an area that is between 0.04 and 25 square micrometers.

Every two adjacent electrodes 130, i.e. a pair of first electrode 131 and second electrode 132, have a distance C from each other. The distance C may be determined based on a design requirement related to a capacitance value of each of the capacitors. In one embodiment, the distance C is at least 0.19 micrometer. According to various embodiments, the plurality of capacitors following a layout shown in FIG. 1 can have a high area density, e.g. 5 to 225 capacitors per 100 square micrometers.

Figure 2A:
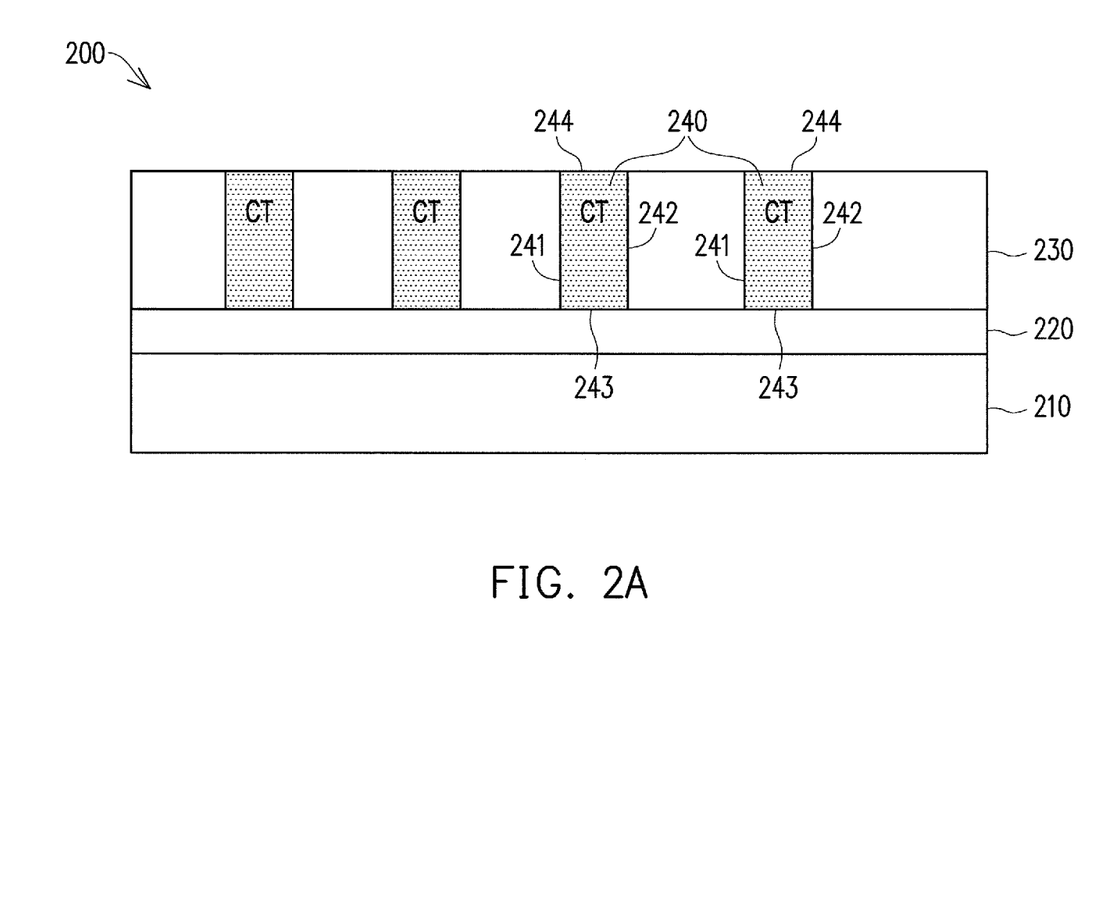
FIG. 2A illustrates a cross-sectional view of a semiconductor device having vertical capacitor structures, in accordance with some embodiments of the present disclosure.

FIG. 2A illustrates a cross-sectional view of a semiconductor device 200 having vertical capacitor structures, in accordance with some embodiments of the present disclosure. As shown in FIG. 2A, the semiconductor device 200 in this example includes: an active region or a substrate 210; an insulation layer 220 on the substrate 210; and a dielectric layer 230 on the insulation layer 220.

The semiconductor device 200 in this example further includes a plurality of contacts 240 formed within the dielectric layer 230. Accordingly, the dielectric layer 230 may also be called a contact layer. Each of the plurality of contacts 240 is made of a metal material, e.g. tungsten, aluminum, copper, etc., and stops onto the insulation layer 220. In one embodiment, while the substrate 210 comprises a semiconductor material like silicon, the insulation layer 220 comprises a dielectric material like resist protective oxide. As such, the plurality of contacts 240 can stop onto the insulation layer 220 and be electrically isolated from each other. Other than the plurality of contacts 240, the remaining portion of the dielectric layer 230 forms an insulating structure between every two adjacent contacts 240.

As shown in FIG. 2A, each of the plurality of contacts 240 has a left sidewall 241, a right sidewall 242, a bottom surface 243, and a top surface 244. The bottom surface 243 is in contact with the insulation layer 220. An insulator, which is part of the insulating structure of the dielectric layer 230, is coupled to opposite sidewalls of a pair of two contacts adjacent to each other, i.e. is coupled to a left sidewall 241 of a right contact in the pair and a right sidewall 242 of a left contact in the pair. As such, each pair of two adjacent contacts and the insulator there between form a capacitor. Accordingly, each contact 240 can be called an electrode of the capacitor. As shown in FIG. 2A, each contact 240 is a finger type electrode extending vertically, i.e. along a vertical direction perpendicular to the substrate 210.

Figure 2B:
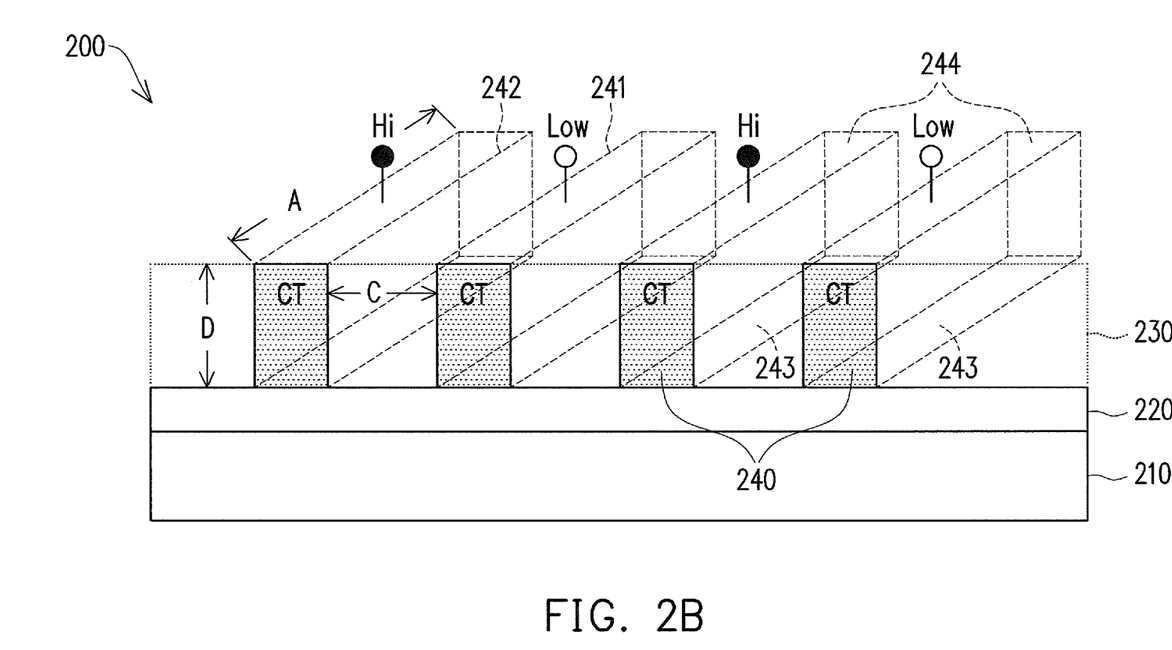
FIG. 2B illustrates a perspective view of vertical capacitor structures of a semiconductor device, in accordance with some embodiments of the present disclosure.

FIG. 2B illustrates a perspective view of vertical capacitor structures of the semiconductor device 200, in accordance with some embodiments of the present disclosure. As shown in FIG. 2B, each contact 240 stops on the insulation layer 220 which comprises oxide and/or nitride material that electrically isolates the contacts 240 from each other. In addition, each contact 240 is electrically connected to a logic high voltage or a logic low voltage, e.g. via at least one metal layer over the dielectric layer 230. Every two adjacent contacts 240 are connected to two different voltages, i.e. a logic high voltage and a logic low voltage, respectively. That is, contacts connected to a logic high voltage and contacts connected to a logic low voltage are interlaced with each other. The contacts 240 separated by the insulating structure of the dielectric layer 230 form a plurality of capacitors connected in series. Each of the plurality of capacitors stores electrical energy in an electric field having a horizontal direction, i.e. a direction parallel to the substrate 210. As shown in FIG. 2B, each contact 240 is a finger type electrode of a capacitor and extends vertically, i.e. along a direction perpendicular to the substrate 210. Accordingly, each of the plurality of capacitors is called a vertical capacitor herein.

Each contact 240 has sidewalls 241, 242 and a bottom surface 243 in contact with the insulation layer 220. As shown in FIG. 2B, each sidewall 241, 242 of each contact 240 has a rectangular shape with same dimensions. To be specific, each sidewall 241, 242 has a first dimension A and a second dimension D, where the second dimension D is equal to a height of the dielectric layer 230. In addition, every two adjacent contacts 240 have a distance C from each other. As such, a capacitance of the capacitor formed by two adjacent contacts 240 is proportional to A*D/C. By adjusting the area A*D of the sidewalls 241, 242 and/or the distance C between two adjacent contacts 240, a desirable capacitance can be achieved based on a design requirement. In addition, the plurality of capacitors can achieve a high area density based on the vertical capacitor structure and the adjusted dimensions. As shown in FIG. 2B, the top surface 244 and the bottom surface 243 of each contact 240 also have a rectangular shape.

FIGS. 3A, 3B, 3C, 3D, 3E, 3F, 3G, 3H, 3I, and 3J illustrate cross-sectional views of an exemplary semiconductor device during various fabrication stages, in accordance with some embodiments of the present disclosure. In some embodiments, the semiconductor device may be a device comprising MIM capacitors. The semiconductor device may be included in a microprocessor, memory cell, and/or other integrated circuit (IC). In addition, FIGS. 3A through 3J are simplified for a better understanding of the concepts of the present disclosure. For example, although the figures illustrate the MIM capacitors, it is understood the IC, in which the MIM capacitors is formed, may include a number of other layers comprising metal layers, a polymer layer, a passivation layer, etc., and may include a number of other devices comprising resistors, capacitors, inductors, fuses, etc., which are not shown in FIGS. 3A through 3J, for purposes of clarity of illustration.

Figure 3A:
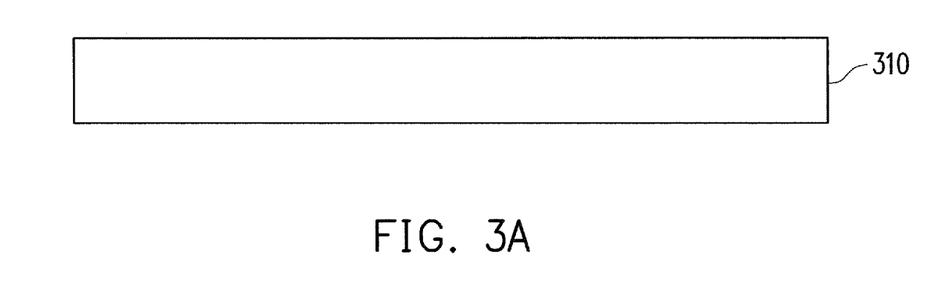
FIGS. 3A, 3B, 3C, 3D, 3E, 3F, 3G, 3H, 3I, and 3J illustrate cross-sectional views of an exemplary semiconductor device during various fabrication stages, in accordance with some embodiments of the present disclosure.

FIG. 3A is a cross-sectional view of the semiconductor device including an active region 310, which is provided, at one of the various stages of fabrication, according to some embodiments of the present disclosure. The active region 310 in FIG. 3A may comprise a semiconductor material, e.g. silicon, and serve as a substrate for upper layers to be formed on.

Figure 3B:
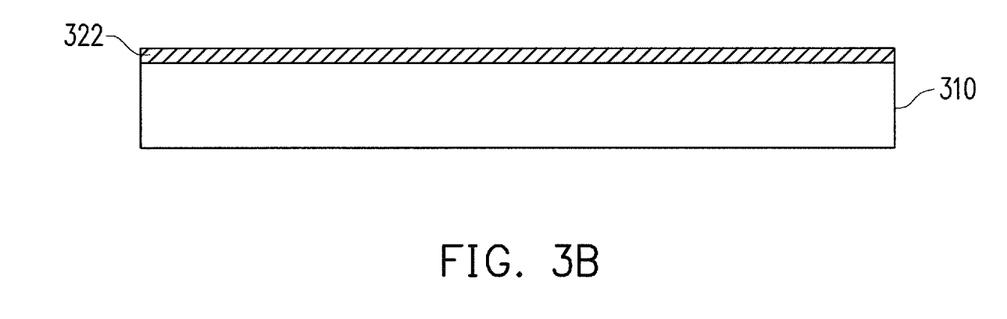

FIG. 3B is a cross-sectional view of the semiconductor device including a first oxide layer 322, which is formed on the substrate 310 at one of the various stages of fabrication, according to some embodiments of the present disclosure. According to some embodiments, the first oxide layer 322 may be formed by depositing an oxide material, e.g. silicon oxide, on the substrate 310.

Figure 3C:
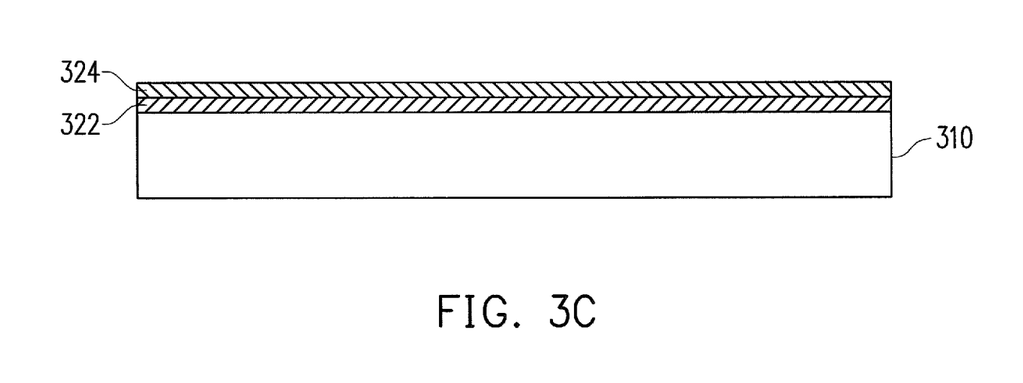

FIG. 3C is a cross-sectional view of the semiconductor device including a nitride layer 324, which is formed on the first oxide layer 322 at one of the various stages of fabrication, according to some embodiments of the present disclosure. According to some embodiments, the nitride layer 324 may be formed by depositing a nitride material, e.g. silicon nitride, on the first oxide layer 322.

Figure 3D:
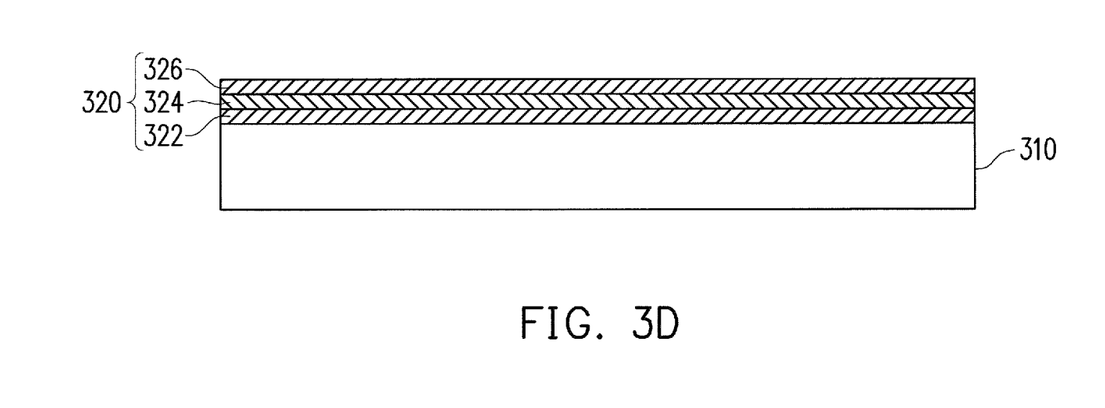

FIG. 3D is a cross-sectional view of the semiconductor device including a second oxide layer 326, which is formed on the nitride layer 324 at one of the various stages of fabrication, according to some embodiments of the present disclosure. According to some embodiments, the second oxide layer 326 may be formed by depositing an oxide material, e.g. silicon oxide, on the nitride layer 324. The layers 322, 324, 326 all include dielectric materials and together form an insulation layer 320 to serve as a stop layer for contacts to be formed on. While the insulation layer 320 has three sub-layers as shown in FIG. 3D, it may have more or less than three sub-layers in other embodiments. In some embodiments, each sub-layer of the insulation layer 320 may include at least one of: silicon oxide, silicon nitride, resist protective oxide (RPO), or other suitable dielectric material that can stop a contact to be formed on.

Figure 3E:
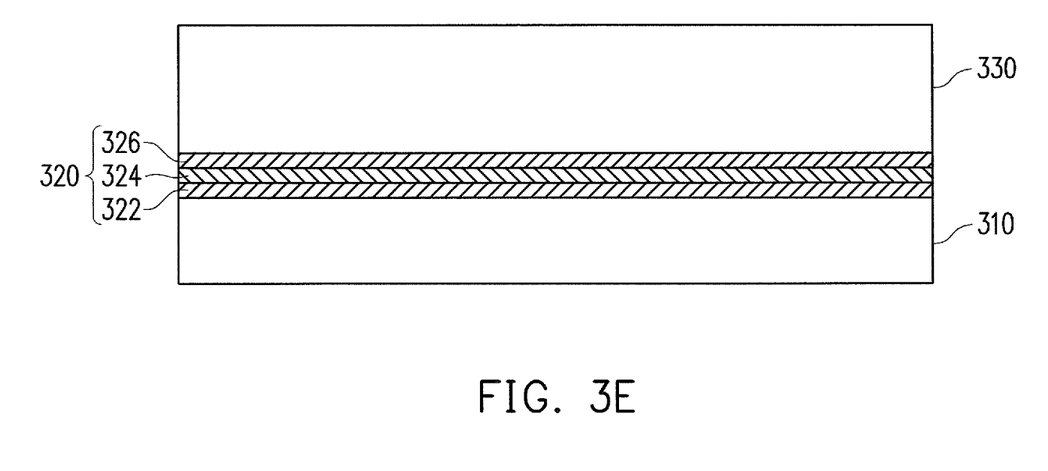

FIG. 3E is a cross-sectional view of the semiconductor device including a dielectric layer 330, which is formed on the second oxide layer 326 at one of the various stages of fabrication, according to some embodiments of the present disclosure. According to some embodiments, the dielectric layer 330 may be formed by depositing a dielectric material on the second oxide layer 326. In some embodiments, the dielectric material of the dielectric layer 330 may include a high-k dielectric material comprising: SiOx, SiNx, SiOxNy, ZrO$_2$, Al$_2$O$_3$, HfOx, HfSiOx, ZrTiOx, TiO$_2$, TaOx, etc., or any combinations thereof.

Figure 3F:
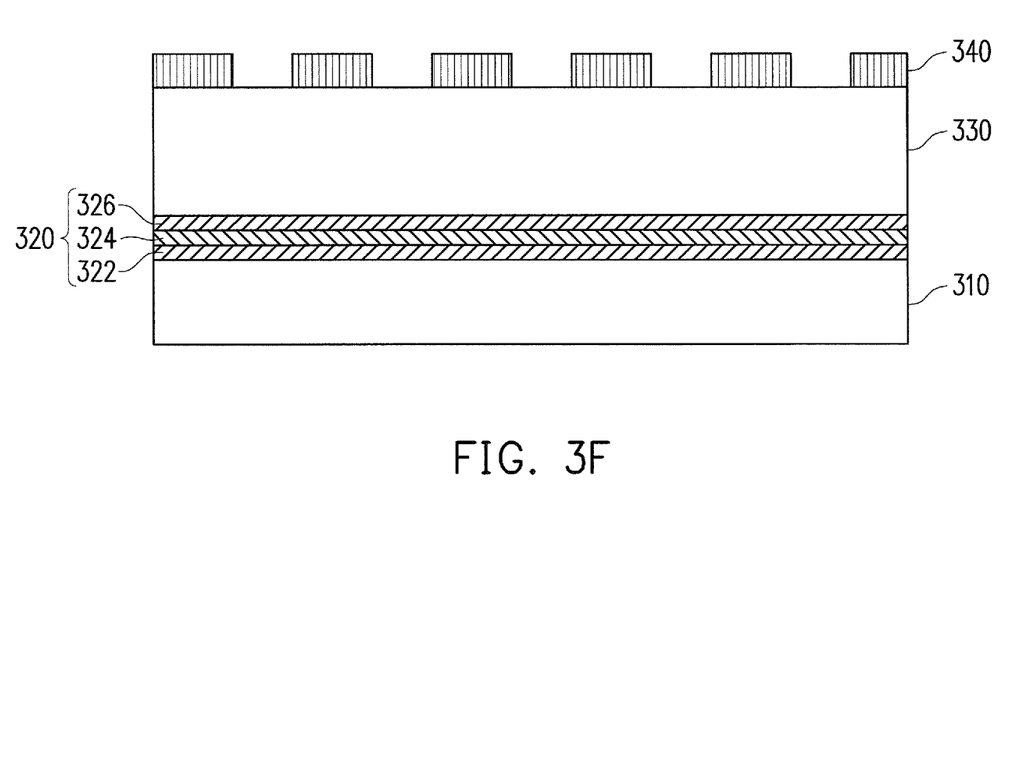

FIG. 3F is a cross-sectional view of the semiconductor device including a patterned mask 340, which is formed on the dielectric layer 330 at one of the various stages of fabrication, according to some embodiments of the present disclosure. According to some embodiments, the patterned mask 340 may be formed by depositing a photoresist material on the dielectric layer 330, and a patterning process to form a pattern or profile on the patterned mask 340.

Figure 3G:
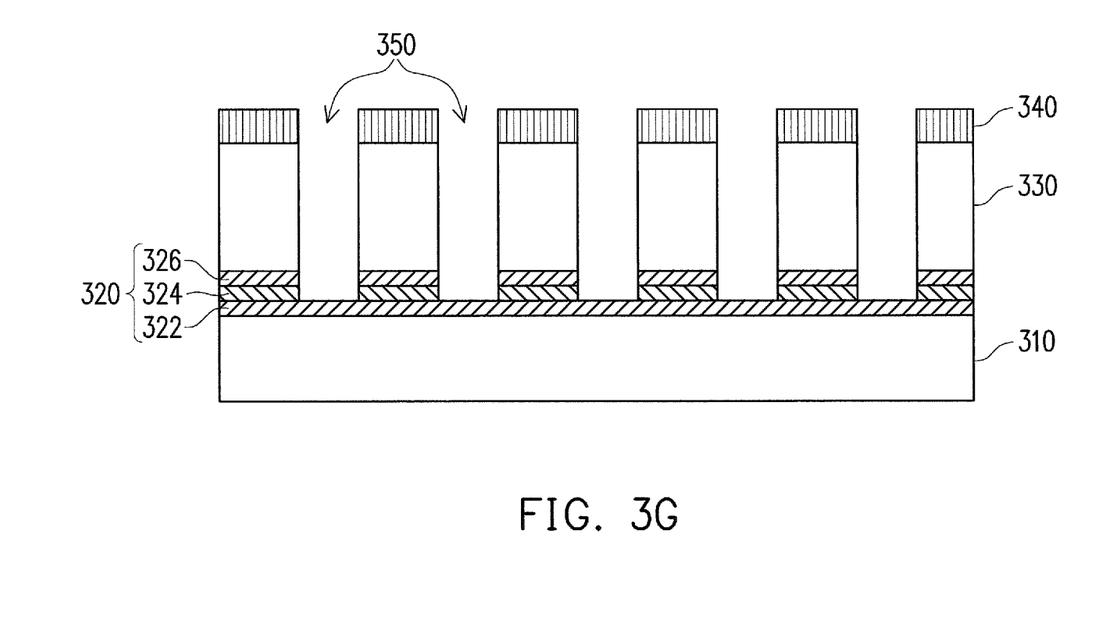

FIG. 3G is a cross-sectional view of the semiconductor device including a plurality of trenches 350, which is formed in the dielectric layer 330 at one of the various stages of fabrication, according to some embodiments of the present disclosure. According to some embodiments, the plurality of trenches 350 may be formed based on a dry/wet etching process and a pattern of the mask 340. For example, portions of the dielectric layer 330 that are not covered by the pre-defined pattern of the patterned mask 340 may be etched based on the pattern to form the plurality of trenches 350.

As shown in FIG. 3G, each of the plurality of trenches 350 stops within the insulation layer 320. In this example, at a bottom of each of the plurality of trenches 350, the second oxide layer 326 is completely removed; the nitride layer 324 is also completely removed; but the first oxide layer 322 is not removed. In another embodiment, at a bottom of each of the plurality of trenches 350, the second oxide layer 326 is completely removed; the nitride layer 324 is partially removed; and the first oxide layer 322 is not removed. In yet another embodiment, at a bottom of each of the plurality of trenches 350, the second oxide layer 326 is completely removed; the nitride layer 324 is also completely removed; and the first oxide layer 322 is partially removed. In any case, each of the plurality of trenches 350 stops within the insulation layer 320, i.e. stopping at the second oxide layer 326, the nitride layer 324, or the first oxide layer 322, without exposing the substrate 310. In some embodiments, a cleaning process and a soft/hard baking process are also performed to form the plurality of trenches 350.

Figure 3H:
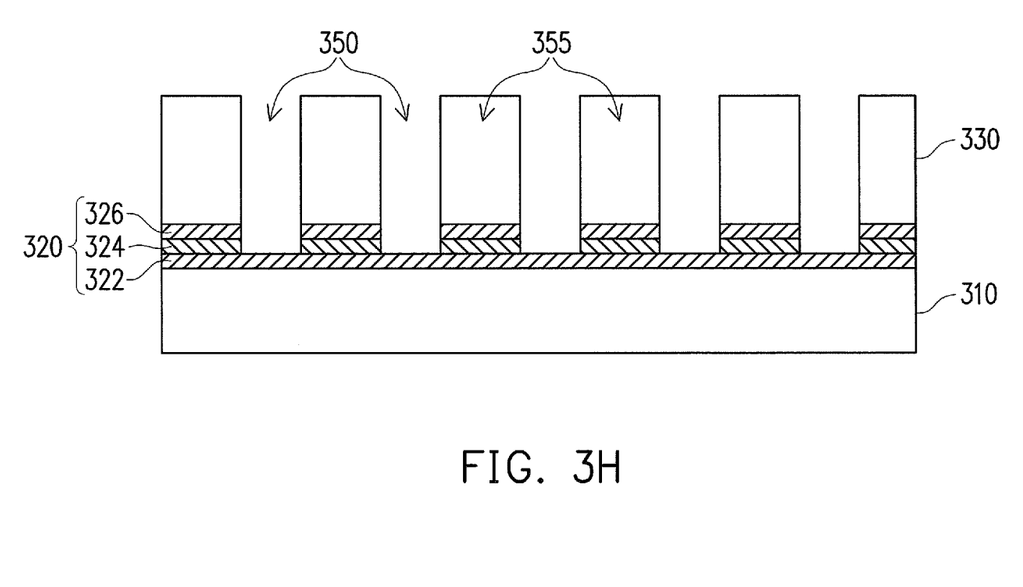

FIG. 3H is a cross-sectional view of the semiconductor device, where the mask 340 is removed at one of the various stages of fabrication, according to some embodiments of the present disclosure. According to some embodiments, the mask 340 is removed by a cleaning process. As shown in FIG. 3H, the plurality of trenches 350 divides the dielectric layer 330 into a plurality of stacks 355. Each of the plurality of stacks 355 comprises a dielectric material, e.g. a high-k dielectric material comprising: SiOx, SiNx, SiOxNy, ZrO$_2$, Al$_2$O$_3$, HfOx, HfSiOx, ZrTiOx, TiO$_2$, TaOx, etc., or any combinations thereof.

Figure 3I:
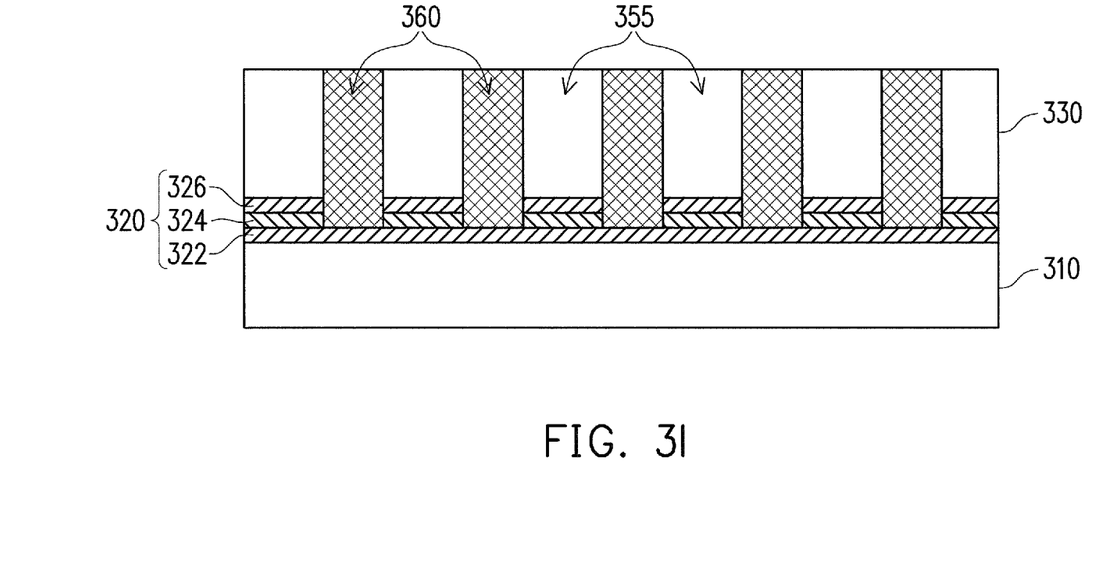

FIG. 3I is a cross-sectional view of the semiconductor device including a plurality of contacts 360, which is formed in the plurality of trenches 350 at one of the various stages of fabrication, according to some embodiments of the present disclosure. According to some embodiments, each of the plurality of contacts 360 is formed by depositing a conductive material to fill up the plurality of trenches 350. In some embodiments, the conductive material may be formed of a metal material, e.g., copper (Cu), aluminum (Al), tungsten (W), etc. As such, every two adjacent contacts 360 are separated by an insulator 355 comprising a dielectric material, to form an MIM capacitor. Each of the plurality of contacts 360 is an electrode for the MIM capacitor. In one embodiment, the plurality of stacks or insulators 355 are coupled to each other to form an insulating structure in the dielectric layer 330.

Figure 3J:
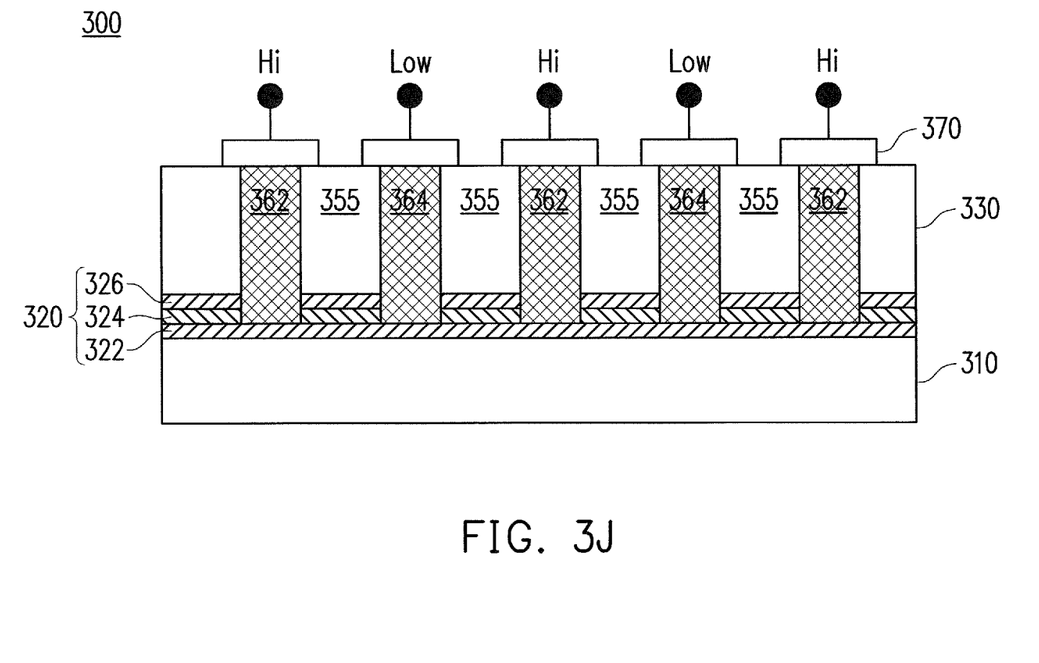

FIG. 3J is a cross-sectional view of the semiconductor device 300 including a metal layer 370, which is formed on the plurality of contacts 360 at one of the various stages of fabrication, according to some embodiments of the present disclosure. As shown in FIG. 3J, the plurality of contacts or electrodes 360 are divided into a group of first electrodes 362 and a group of second electrodes 364 that are interlaced with each other. According to some embodiments, the metal layer 370 is formed by depositing a metal material, e.g. aluminum, copper, etc., onto the first electrodes 362 and the second electrodes 364. In one embodiment, as shown in FIG. 3J, the first electrodes 362 are connected to a logic high voltage via the metal layer 370; and the second electrodes 364 are connected to a logic low voltage via the metal layer 370. In another embodiment, the first electrodes 362 are connected to a logic low voltage via the metal layer 370; and the second electrodes 364 are connected to a logic high voltage via the metal layer 370.

Figure 4:
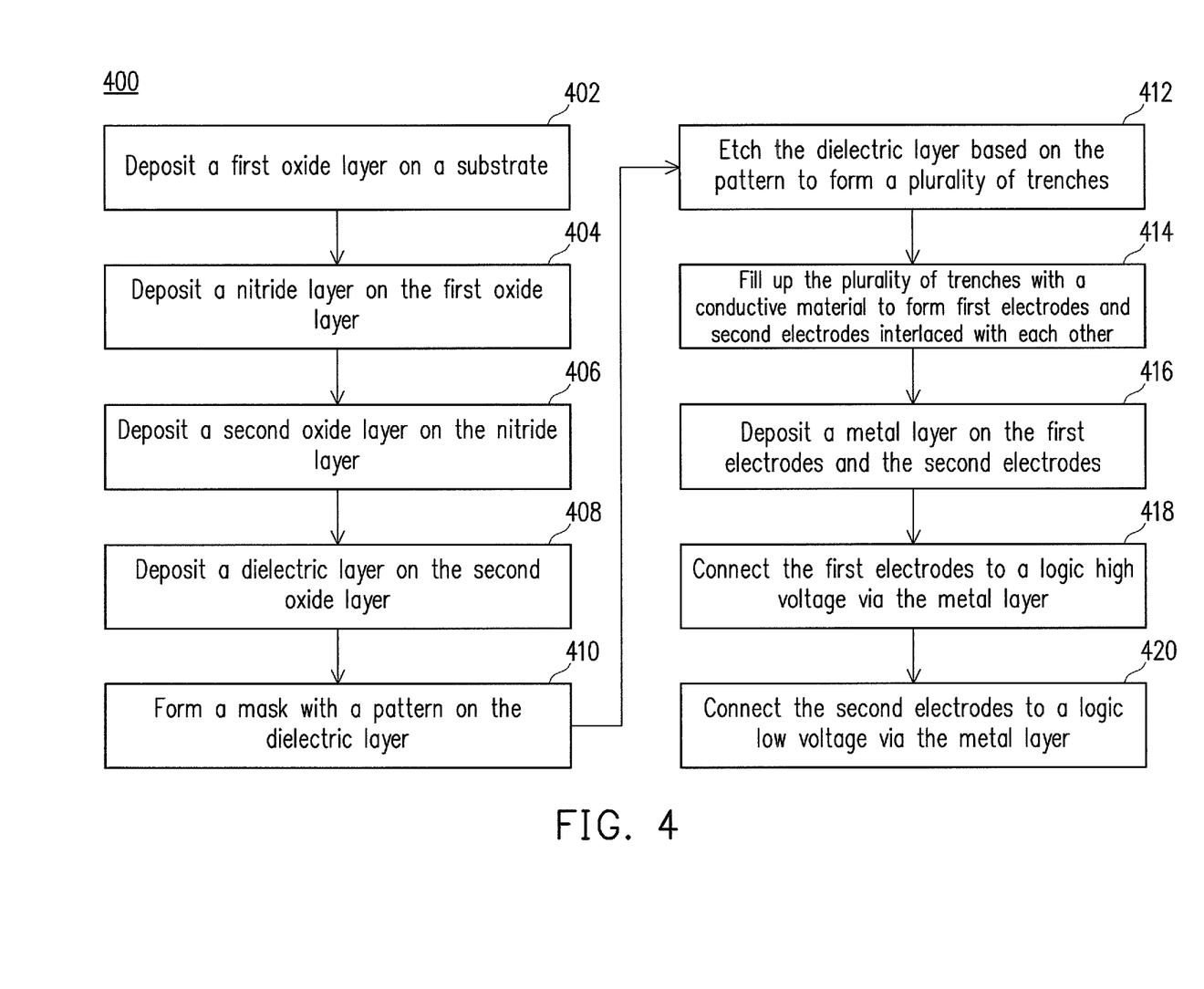
FIG. 4 is a flow chart illustrating an exemplary method for forming a semiconductor device having vertical capacitor structures, in accordance with some embodiments of the present disclosure.

FIG. 4 is a flow chart illustrating an exemplary method 400 for forming a semiconductor device having vertical capacitor structures, in accordance with some embodiments of the present disclosure. At operation 402, a first oxide layer is deposited on a substrate. A nitride layer is deposited at operation 404 on the first oxide layer. At operation 406, a second oxide layer is deposited on the nitride layer. A dielectric layer is deposited at operation 408 on the second oxide layer. At operation 410, a mask is formed with a pattern on the dielectric layer.

At operation 412, the dielectric layer is etched based on the pattern to form a plurality of trenches. As discussed above, each of the plurality of trenches stops within the first oxide layer, the nitride layer, or the second oxide layer. The plurality of trenches are filled up at operation 414 with a conductive material to form first electrodes and second electrodes interlaced with each other. Every two adjacent electrodes, i.e. a first electrode and a second electrode, are electrically isolated by an insulator between them and by the oxide or nitride layer below them, to form a capacitor. All the electrodes form a plurality of capacitors connected in series.

At operation 416, a metal layer is deposited on the first electrodes and the second electrodes. At operation 418, the first electrodes are connected to a logic high voltage via the metal layer. At operation 420, the second electrodes are connected to a logic low voltage via the metal layer. It can be understood that the order of the operations shown in FIG. 4 may be changed according to different embodiments of the present disclosure. The capacitors formed according to the disclosed method can achieve a high area density. The disclosed method does not need an extra mask or etching process to form a capacitor top metal (CTM) electrode.

In an embodiment, a semiconductor device is disclosed. The semiconductor device includes: an insulation layer, a first electrode with sidewalls and a bottom surface in contact with the insulation layer; a second electrode with sidewalls and a bottom surface in contact with the insulation layer; and an insulator formed between the first electrode and the second electrode. The insulator is coupled to a sidewall of the first electrode and coupled to a sidewall of the second electrode.

In another embodiment, a semiconductor device is disclosed. The semiconductor device includes: a substrate; an insulation layer on the substrate; a dielectric layer on the insulation layer; a plurality of first electrodes formed within the dielectric layer; and a plurality of second electrodes formed within the dielectric layer. The first electrodes and the second electrodes are interlaced with each other. The dielectric layer comprises an insulating structure formed between the first electrodes and the second electrodes.

In yet another embodiment, a method for forming a semiconductor device is disclosed. The method includes: forming an insulation layer on a substrate; depositing a dielectric layer on the insulation layer; and forming a plurality of electrodes within the dielectric layer. The plurality of electrodes comprises first electrodes and second electrodes that are interlaced with each other. The dielectric layer comprises an insulating structure between the first electrodes and the second electrodes.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an insulation layer; and
a dielectric layer comprising:
a first electrode with sidewalls and a bottom surface in contact with the insulation layer,
a second electrode with sidewalls and a bottom surface in contact with the insulation layer, and
an insulator formed between the first electrode and the second electrode, wherein the insulator is coupled to a sidewall of the first electrode and coupled to a sidewall of the second electrode, wherein:
the first electrode is electrically connected to a first voltage,
the second electrode is electrically connected to a second voltage different from the first voltage, and wherein:
the bottom surface of the first electrode has a first shape;
the bottom surface of the second electrode has a second shape; and
the first shape and the second shape have same dimensions and a same area,
the first electrodes are electrically connected to a first voltage via the at least one metal layer;
the second electrodes are electrically connected to a second voltage via the at least one metal layer; and
the first voltage is higher than the second voltage.

2. The semiconductor device of claim 1, wherein the first and second shapes are rectangular shapes.

3. The semiconductor device of claim 2, wherein:
the first shape and the second shape each have an area smaller than 25 square micrometers.

4. The semiconductor device of claim 1, wherein:
each of the first and second electrodes includes a conductive material; and
the dielectric layer comprises an insulating structure formed between the first electrode and the second electrode.

5. The semiconductor device of claim 4, wherein:
the first and second electrodes form a plurality of capacitors connected in series.

6. The semiconductor device of claim 1, wherein:
each of the first electrode and the second electrode includes tungsten.

7. The semiconductor device of claim 1, wherein the insulation layer comprises a plurality of sub-layers.

8. The semiconductor device of claim 7, wherein the plurality of sub-layers comprises:
at least one nitride layer; and
at least one oxide layer.

9. A semiconductor device, comprising:
a substrate;
an insulation layer on the substrate;
a dielectric layer on the insulation layer;
a plurality of first electrodes formed within the dielectric layer; and
a plurality of second electrodes formed within the dielectric layer, wherein
the first electrodes and the second electrodes are interlaced with each other and form an electrode array extending along a first direction, and
top surfaces of the first electrodes and the second electrodes have a same shape, and wherein:
each of the first electrodes and the second electrodes includes a conductive material;
the dielectric layer comprises an insulating structure formed between the first electrodes and the second electrodes;
each of the plurality of first electrodes has sidewalls and a bottom surface in contact with the insulation layer;
each of the plurality of second electrodes has sidewalls and a bottom surface in contact with the insulation layer; and
the insulating structure is coupled to the sidewalls of the first electrodes and the second electrodes,
the first electrodes are electrically connected to a first voltage via the at least one metal layer;
the second electrodes are electrically connected to a second voltage via the at least one metal layer; and
the first voltage is higher than the second voltage.

10. The semiconductor device of claim 9, further comprising:
at least one metal layer over the dielectric layer.

11. The semiconductor device of claim 10, wherein:
the first voltage is a logic high voltage and the second voltage is a logic low voltage.

12. The semiconductor device of claim 9, wherein:
bottom surfaces of each of the first electrodes has a first rectangular shape; and
bottom surfaces of each of the second electrodes has a second rectangular shape.

13. The semiconductor device of claim 12, wherein:
the first rectangular shape and the second rectangular shape have same dimensions and a same area smaller than 25 square micrometers.

14. The semiconductor device of claim 9, wherein:
the interlaced first and second electrodes form a plurality of capacitors connected in series; and
each of the plurality of capacitors stores electrical energy in an electric field that has a direction parallel to the substrate.

15. The semiconductor device of claim 14, wherein:
the plurality of capacitors has an area density of at least 5 capacitors per 100 square micrometers.

16. A method for forming a semiconductor device, comprising:
forming an insulation layer on a substrate;
depositing a dielectric layer on the insulation layer; and
forming a plurality of electrodes within the dielectric layer, wherein
the plurality of electrodes comprises first electrodes and second electrodes that are interlaced with each other and form an electrode array extending along a first direction, and
top surfaces of the plurality of electrodes have a same shape,
wherein forming the insulation layer comprises:
depositing a first oxide layer on the substrate;
depositing a nitride layer on the first oxide layer; and
depositing a second oxide layer on the nitride layer.

17. The method of claim 16, wherein the first electrodes are electrically connected to a first voltage via at least one metal layer, the second electrodes are electrically connected to a second voltage via the at least one metal layer, and the first voltage is higher than the second voltage.

18. The method of claim 17, wherein forming the plurality of electrodes comprises:
depositing a mask on the dielectric layer;
forming a pattern on the mask;
etching the dielectric layer based on the pattern to form a plurality of trenches; and
filling up the plurality of trenches with a conductive material to form the plurality of electrodes.

19. The method of claim 18, wherein etching the dielectric layer comprises:
removing completely the second oxide layer at a bottom of each of the plurality of trenches; and
removing at least partially the nitride layer at the bottom of each of the plurality of trenches.

20. The method of claim 16, further comprising:
depositing a metal layer on the first electrodes and the second electrodes;
connecting the first electrodes to a first voltage via the metal layer; and
connecting the second electrodes to a second voltage via the metal layer, wherein the first voltage is higher than the second voltage.

* * * * *